United States Patent [19]

Somemiya et al.

[11] Patent Number: 5,130,895
[45] Date of Patent: Jul. 14, 1992

[54] APPARATUS HAVING ROTARY MEMBER

[75] Inventors: Masayuki Somemiya; Yosuke Haga, both of Tokyo, Japan

[73] Assignee: TEAC Corporation, Japan

[21] Appl. No.: 606,574

[22] Filed: Oct. 31, 1990

[30] Foreign Application Priority Data

Nov. 8, 1989 [JP] Japan .................. 1-130224[U]

[51] Int. Cl.$^5$ .............................................. H05K 1/00
[52] U.S. Cl. ..................... 361/398; 174/254; 360/106; 901/48
[58] Field of Search ............ 174/254; 360/97.01, 360/106, 369; 361/397, 398; 74/813, 819; 267/158-164; 901/48

[56] References Cited

U.S. PATENT DOCUMENTS 5,014,145 5/1991 Hosokawa et al. .................. 360/137
5,025,335 6/1991 Stefansky ............................ 360/137

FOREIGN PATENT DOCUMENTS 0058669 4/1984 Japan .................................... 360/106

OTHER PUBLICATIONS

IBM Technical Disclosure Bulletin "Disk Drive For Interchangeable Flexible Disk Cartridges" by M. W. J. Carmichael and N. A. Feliss vol. 20 No. 11A Apr. 1978.
IBM Technical Disclosure Bulletin "Actuator Assembly For a Disk File" by J. P. G. Dunman, R. O'Regan and J. C. Troke vol. 20 No. 5, Oct. 1977.

Primary Examiner—Leo P. Picard
Assistant Examiner—Donald A. Sparks
Attorney, Agent, or Firm—Andrus, Sceales, Starke & Sawall

[57] ABSTRACT

An apparatus having a rotary member rotatable around a shaft mounted on a base and to which a flexible printed circuit board is attached. The flexible printed circuit board is attached to the rotary member at an end thereof, and is fixed via the base at the other end thereof. The flexible printed circuit board has a bent portion between both ends thereof. The bent portion of the flexible printed circuit board is pushed by a pushing member which is mounted on the base so that the direction of an elastic force exerted by the bending of the flexible printed circuit board against the rotary member coincides approximately to the center axis of the shaft irrespective of the position of the rotary member. As a result of that a moment around the shaft, caused by the elastic force, to which moment the rotary member is subjected, is approximately zero.

12 Claims, 11 Drawing Sheets

APPARATUS HAVING ROTARY MEMBER

BACKGROUND OF THE INVENTION

The present invention relates generally to apparatuses having rotary members, and more particularly to an apparatus having a rotary member to which a flexible printed circuit board is attached. The present invention can be applied to a head actuator of a magnetic disk drive, an analog meter and the like.

Figure 1:
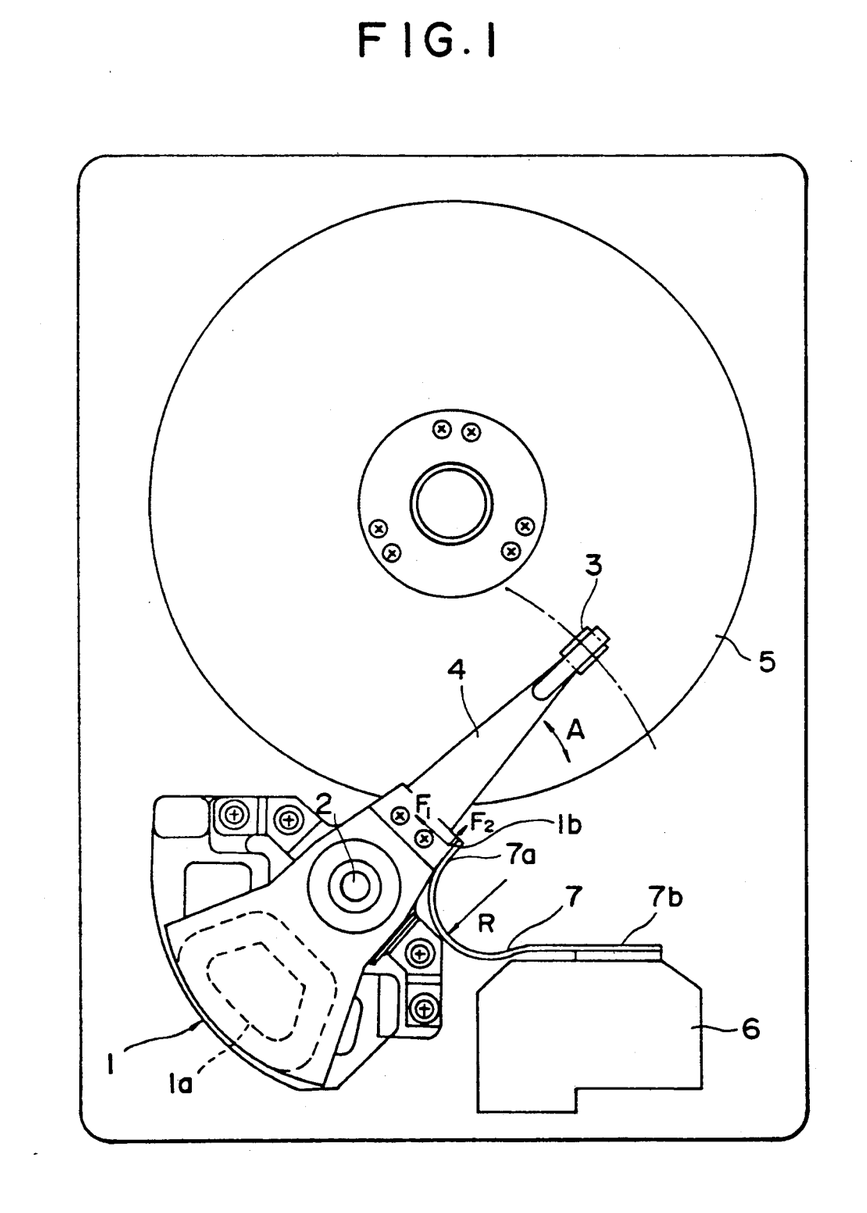
FIG.1 is a plane view of a conventional magnetic disk drive.

A magnetic disk drive shown in FIG.1 is an example of a conventional apparatus to which a flexible printed circuit board (called FPC for short) is attached. A head actuator 1 is a rotary type actuator, and is mounted pivotably around a shaft 2. The actuator 1 comprises a head arm 4 which has a magnetic head 3 at the top thereof. The actuator 1 pivots around the shaft 2, and moves the head 3 in an approximately radial direction (direction A) of a magnetic disk 5 when a voice coil motor having a driving coil 1a is electrified. The head 3 is positioned at a predetermined track according to the current strength supplied to the voice coil motor and the like. Information which is recorded on the disk 5 and/or reproduced therefrom by the head 3, the electricity supplied to the voice coil motor and the like are transmitted between the magnetic disk drive and an external device (not shown) via the FPC 7 and a printed circuit board 6. The FPC 7 is connected to an attachment portion 1b of the actuator 1 at an end 7a thereof, which portion does not block a moving locus of the head 3, and is connected to the printed circuit board 6 at the other end 7b thereof.

However, the conventional magnetic disk drive has the following disadvantages. The actuator 1 is subjected to a force $F_1$ at the attachment portion 1b in a direction vertical to the tangential direction of the FPC 7 at the end 7a thereof and a force $F_2$ in a direction parallel to the tangential direction. The actuator 1 can rotate within a range of approximately 20° angles, and within this range, the force $F_1$ influences the actuator 1 more negatively than the force $F_2$.

Figure 2:
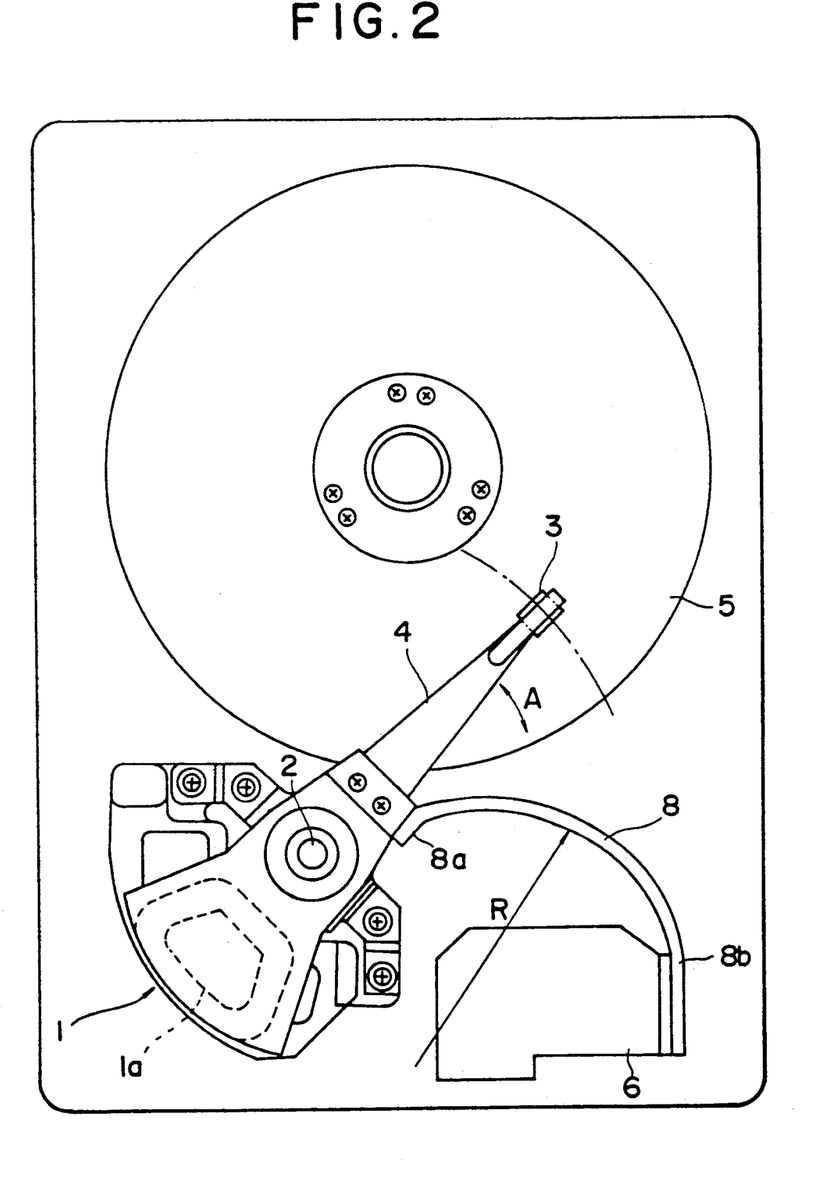
FIG.2 is a plane view of a magnetic disk drive having a long flexible printed circuit board.

Therefore:

1. The actuator 1 is subjected to a moment M, counterclockwise around the shaft 2, mainly generated by the force $F_1$, so it is difficult to position the head 3 over the disk 5 precisely;

2. The voice coil motor needs more electricity because the head 3 is positioned against the moment M;

On the other hand, the strength of the force $F_1$ is proportional to the length of a radius R of a bent portion of the FPC 7. The smaller the radius R is, the larger the force $F_1$ (and the moment M) is, while the larger the radius R is, the smaller the force $F_1$ is. The radius R depends upon the rotating of the actuator 1, thus the radius R is largest when the head 3 is at the most inner track of the disk 5, and is smallest when the head 3 is at the most outer track. Therefore the moment M changes depending on the rotating of the actuator 1. Accordingly, when considering the positions of a first track and a second track which is located at a more inner position than the first track, it will be seen that the head 3 spends an amount of time moving from the first track to the second track different from the amount of time spent moving from the second track to the first track. Consequently:

3. The time for moving the head 3 to the predetermined track of the disk 5 (the seek time) cannot be made uniform;

To solve the above problem, it would be conceivable, as shown in FIG.2, to use a long FPC 8 in order to enlarge the radius R. But such a solution includes the following disadvantages. The magnetic disk drive is subjected to noises caused by an external magnetic field. In addition, the longer the FPC 8 is, the longer is a part of the FPC 8 which is crossed with the external magnetic field. Therefore:

4. Recorded and/or reproduced information involves more noise; and

5. The longer FPC is extremely expensive.

Even if the FPC is applied to an analog meter, the analog meter would include disadvantages similar to the above ones.

SUMMARY OF THE INVENTION

Accordingly, it is a general object of the present invention to provide a novel and useful apparatus having a rotary member in which the disadvantages described above are eliminated.

Another object of the present invention is to provide an apparatus having a rotary member to which a flexible printed circuit board is attached so as to minimize a moment around a shaft around which the rotary member rotates.

Yet another object of the present invention is to provide an apparatus having a rotary member which is low in cost.

Still another object of the present invention is to provide an apparatus having a rotary member to which the flexible printed circuit board is attached by a simple attachment operation.

Another more specific object of the present invention is to provide an apparatus having a rotary member which comprises a shaft mounted on a base, a rotary member rotatable about the shaft, a fixing member fixed on the base, a flexible printed circuit board which is connected to the rotary member at an end thereof and is fixed to the fixing member at the other end thereof, the flexible printed circuit board having a bent portion between both ends thereof, and a pushing member which pushes the bent portion of the flexible printed circuit board so that a direction of an elastic force exerted by the bending of the flexible printed circuit board against the rotary member coincides approximately to the center axis of the shaft irrespective of a rotary position of the rotary member, a moment around the shaft, caused by the elastic force, to which moment said rotary member is subjected, being approximately zero.

Other objects and further features of the present invention will become apparent from the following detailed description when read in conjunction with the accompanying drawings.

DESCRIPTION OF PREFERRED EMBODIMENTS

Figure 3:
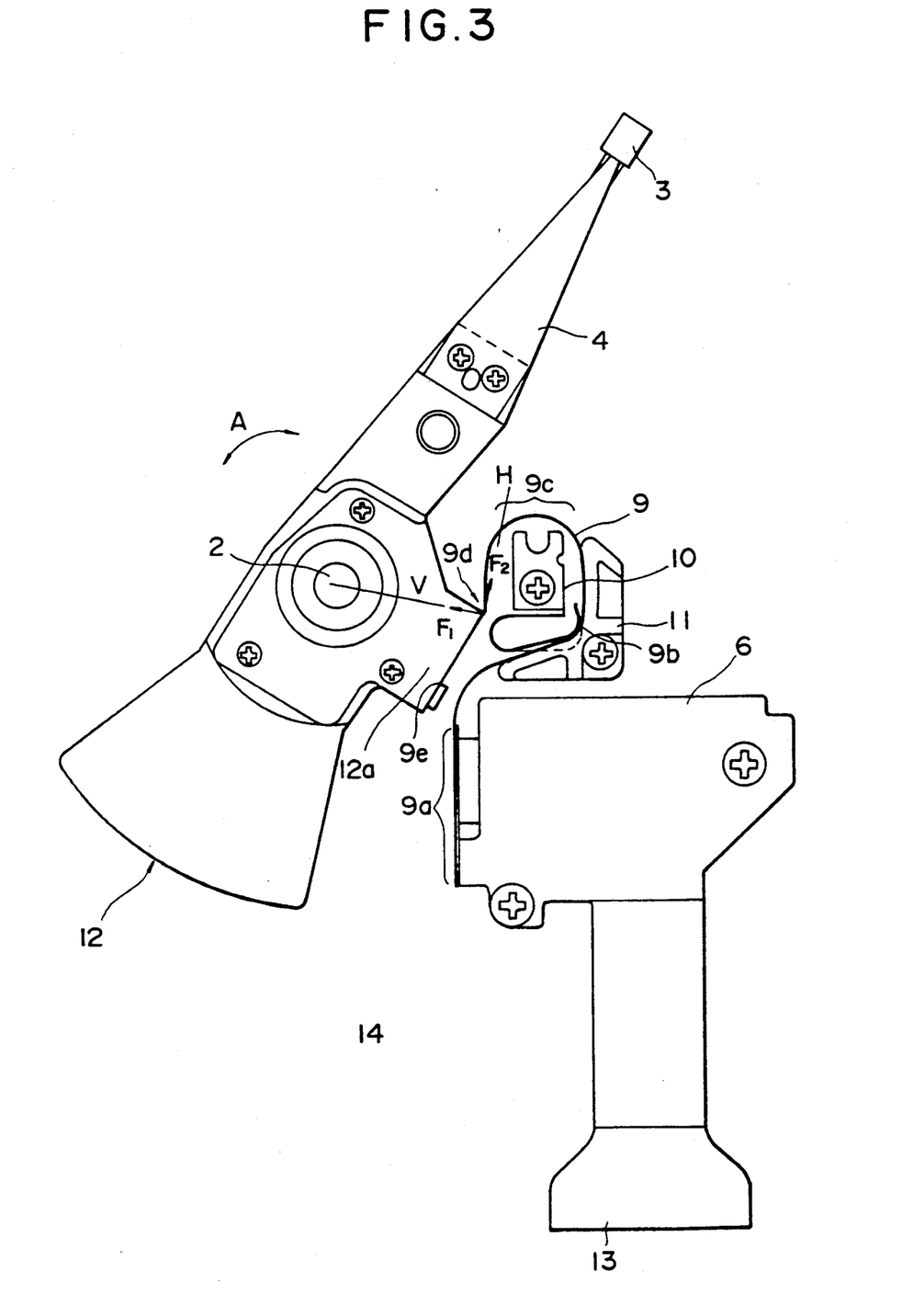
FIG.3 is a plane view of a magnetic disk drive of a first embodiment according to the present invention.

A description will now be given of a magnetic disk drive of a first embodiment according to the present invention with reference to FIG.3 and FIG.4. Those elements in FIG.1 through FIG.9B which correspond to each other are designated by the same reference numerals, and thus a description thereof will be given only once.

As shown in the magnetic disk drive according to the present invention, a FPC 9 is fixed to the printed circuit board 6 at an end part 9a thereof and is connected to a head actuator 12 at another end part thereof between 9d and 9e via a flat spring 10 and stopper 11.

The end part 9a of the FPC 9 may be fixed to any part of the printed circuit board 6. However it is preferable that the FPC 9, which should be as short as possible, be connected with the printed circuit board 6. Accordingly the noise which is included in the information recorded and/or reproduced by the head 3 is lessened and the cost of such a disk drive is low. The printed circuit board 6 is fixed on a base 14 by a screw, and is connected with a connector (not shown) at the junction part 13 thereof. Accordingly, the information recorded and/or reproduced by the head 3 is transmitted between the magnetic disk drive and an external device. The printed circuit board 6 may be a ceramic printed circuit board or a flexible printed circuit board. And, if possible, the end part 9a may be connected directly with the connector without using the printed circuit board 6.

The FPC 9 may be connected to the actuator 12 at the point 9d thereof, however in this embodiment, it is connected with the end part thereof between 9d and 9e for fixing thereto. The actuator 12 is pivotably mounted on the base 14 around the shaft 2. The actuator 12 comprises the head arm 4 having the head 3 at the top thereof, and the attachment portion 12a to which the end part between 9d and 9e of the FPC 9 is attached. The head 3 moves in the approximately radial direction of the disk 5 according to the rotating of the actuator 12, and records the information on the disk 5 and/or reproduces it therefrom. FIG.3 shows only one head, however, needless to say, the number of the heads and head arms is not limited.

The actuator 12 is subjected to the force $F_1$ at the point 9d in the direction vertical to the tangential direction of the FPC 9 at the point 9d (called the direction V for short) and force $F_2$ in the direction parallel to the tangential direction (called the direction H for short). One of the characteristics of the present invention is to make the direction V approximately coincide with the center axis of the shaft 2 so that the moment M around the shaft 2 to which the actuator 12 is subjected exerted by the force $F_1$ is approximately zero. In this embodiment, the FPC 9 is attached so that the tangential direction of the FPC 9 at the point 9d can coincide with a tangential direction of a circle $O_1$ with a radius from the center axis of the shaft 2 to the point 9d, and thus the direction V coincides with the center axis of the shaft 2.

There are some parameters which influence the attaching of the FPC so that the direction V coincides with the center axis of the shaft 2, such as the location of the flat spring 10 and/or the stopper 11, the curvature of a guide surface 11a of the stopper 11, the shape of the attachment portion 12a, the length of a part between the points 9b and 9e of the FPC 9, and the like, which are described later. The actuator 12 is subjected to the moment M counterclockwise around the shaft 2 at the point 9d caused by the forces $F_1$ and $F_2$ of the FPC 9. Incidentally, the FPC 9 is bent sharply at the point 9d, however in this embodiment, a force caused by the sharp bending may be disregarded. The moment M, composed of moment $M_1$ and moment $M_2$ around the shaft 2, is caused by the force $F_1$ and the force $F_2$ respectively. But as mentioned above, the moment $M_2$ is so small that most of the moment M is composed of the moment $M_1$. Therefore in the magnetic drive according to the present invention, the moment $M_1$ is made approximately zero, consequently the moment M is made approximately zero.

The location of the flat spring 10 and/or the stopper 11 will be described below. The FPC 9 is held by the flat spring 10 and the stopper 11, and is pushed by the guide surface 11a. As shown in FIG.4, unless the FPC 9 is held between the actuator 12 and the printed circuit board 6, the force $F_1$ at the point 9d will not always be directed to the center axis of the shaft 2 because of the rotating of the actuator 12. In order to direct the force $F_1$ to the center axis of the shaft 2, the FPC 9 should be pushed in the direction B indicated in FIG.4 and thus it will be directed at the point 9d to the tangential direction of the circle $O_1$. Accordingly, the flat spring 10 and/or the stopper 11 is located as shown in FIG.3 so that the force $F_1$ is directed to the center axis of the shaft 2. The location of the spring 10 and/or the stopper 11 may be determined so that the force $F_1$ is directed approximately to the center axis of the shaft 2 by means of changing the location of the spring 10 and/or the stopper 11 while maintaining the shape of the attachment portion 12a, the length of the FPC 9, and the curvature of the guide surface 11a of the stopper 11 constant. In that case, the spring 10 and/or the stopper 11 ought to be located so as not to interrupt the moving of the FPC 9 while the head 3 moves from the most outer track to the most inner track. Incidentally, the full line in FIG.4 shows the actuator 12 with the head 3 at the most inner track of the disk 5, and the dotted line shows the head 3 at the most outer track.

Figure 5:
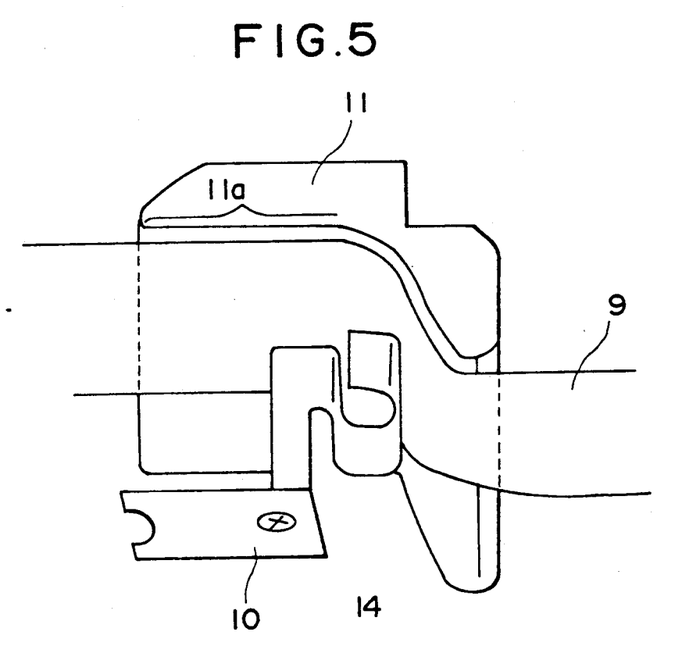
FIG.5 is a perspective view of the flat spring and the stopper of FIG.3.

The FPC 9 has retaining strength by means of the elastic deformation. As shown in FIG.3 and FIG.5, the FPC is held by the spring 10 and/or the stopper 11 at the point 9b thereof, and a part between 9a and 9b is not influenced by the retaining strength. Therefore the spring 10 and the stopper 11 prevent the end part 9a from being disconnected electrically by the retaining strength as well as direct the force $F_1$ to the center axis of the shaft 2. Accordingly, the FPC 9 can transmit the information stably because there is no fear of the FPC 9 being disconnected from the printed circuit board 6 at the end part 9a.

The spring 10 and the stopper 11 are fixed on the base 14 by screws respectively. The spring 10 pushes and holds the FPC 9 at the point 9b thereof. However the means for pushing and holding the FPC 9 is not limited to the flat spring 10, and any means can be selected as long as it can hold the FPC 9 without any damage, such as disconnection, it uses a member small enough to miniaturize the magnetic disk drive, and it can be attached by an easy operation. For example, the FPC 9 may be bonded to the stopper 11 in the vicinity of a part 9b thereof by a bonding material. If the FPC 9 is bonded at the guide surface 11a as a whole, there may occur a case that the actuator 12 cannot rotate because of the bonding. So only "the vicinity of a part 9b" is bonded.

Next, the curvature of the guide surface 11a of the stopper 11 will be described below. The stopper 11 has the guide surface 11a which is a curved surface with a predetermined curvature. The curved surface bends the FPC 9 gradually and holds it there. The pushing force by the guide surface 11a against the FPC 9 depends upon the curvature. In this embodiment, the guide surface is formed approximately straight, however it may be formed with a curvature of a concentric circle which is centered at the shaft 2.

Figure 6A:
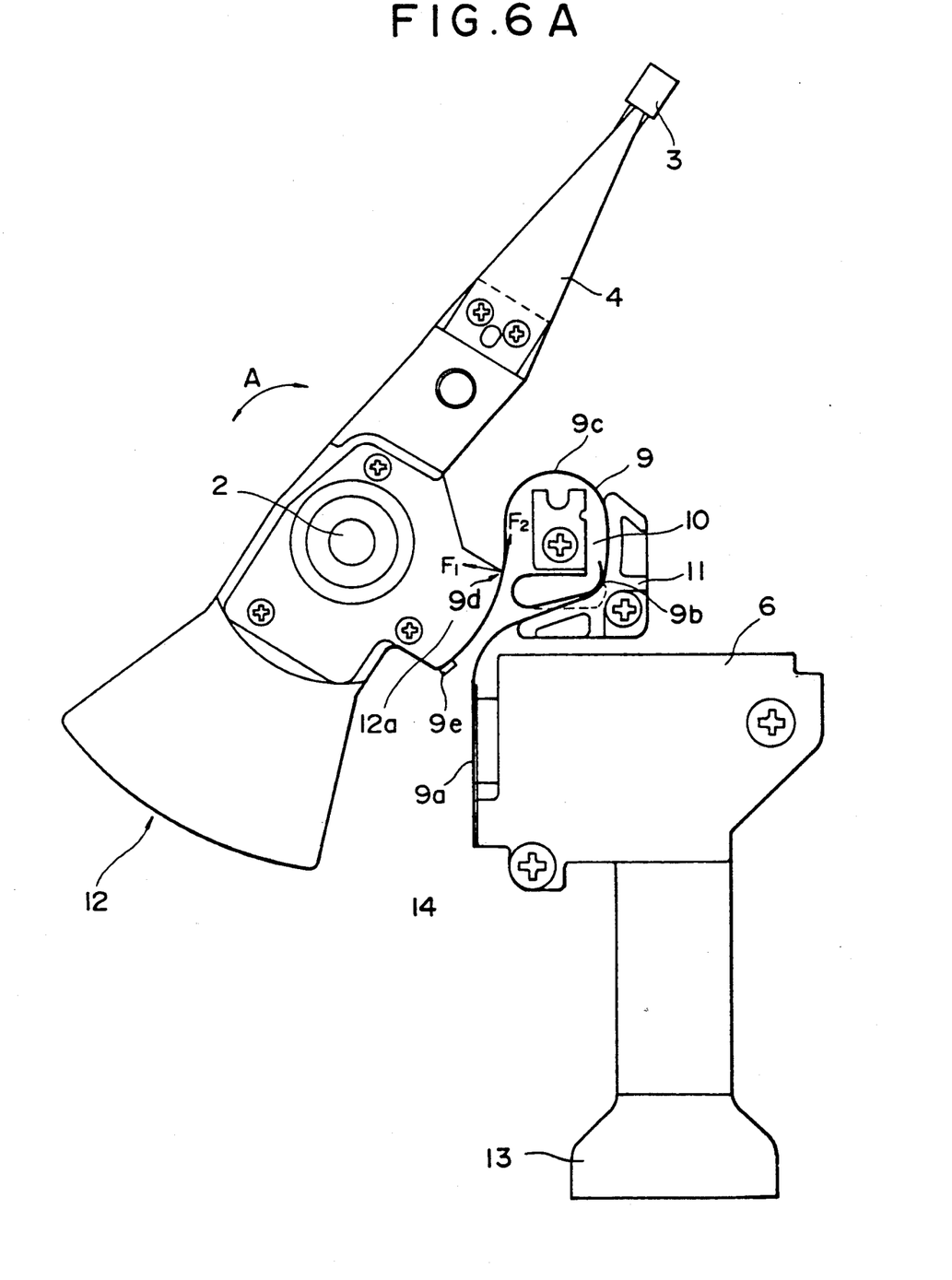
FIG.6A to FIG.6C are respectively plane views of magnetic disk drives having an actuator with an attachment portion different from that shown in FIG.3.
Figure 6B:
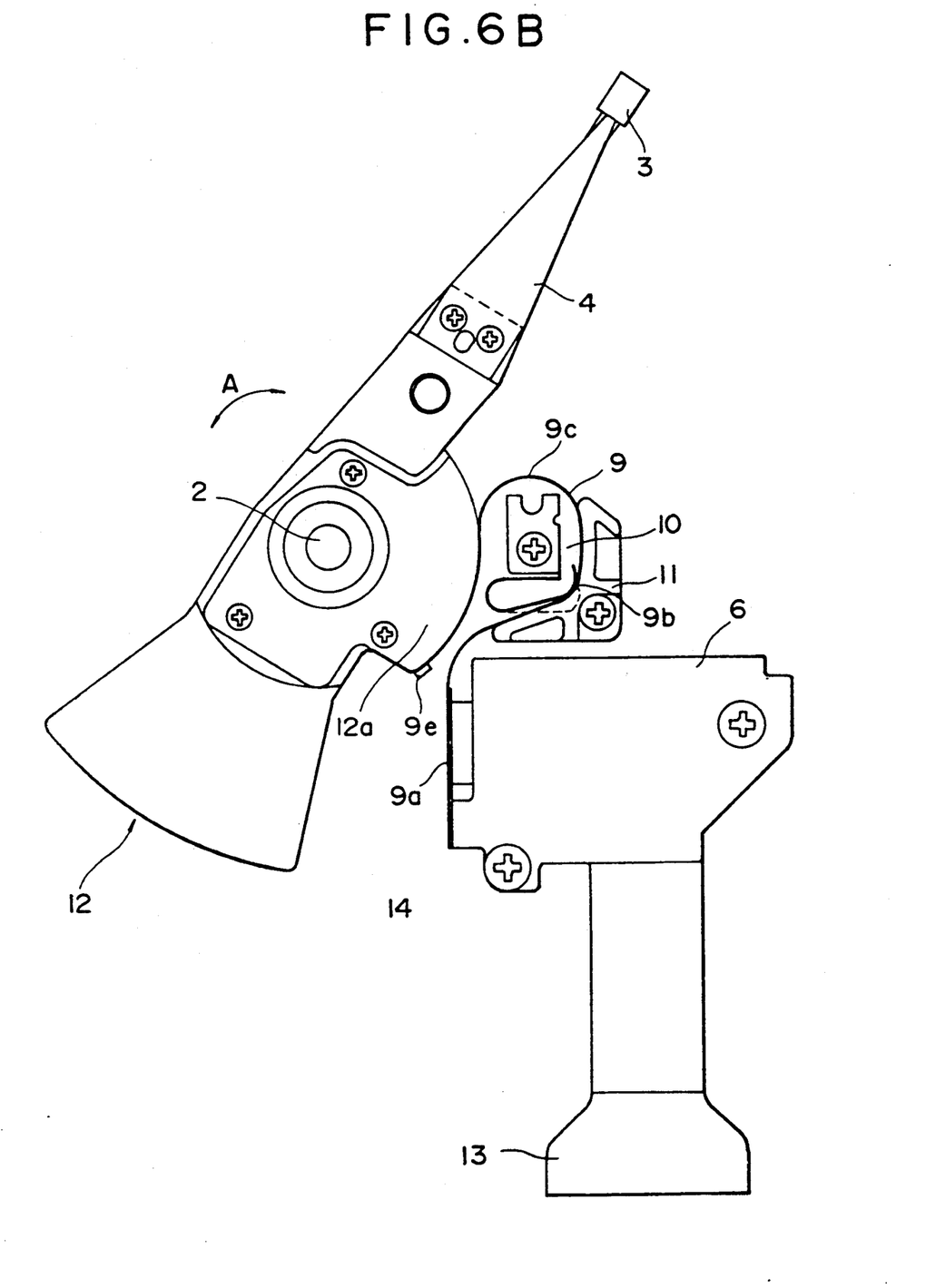
Figure 6C:
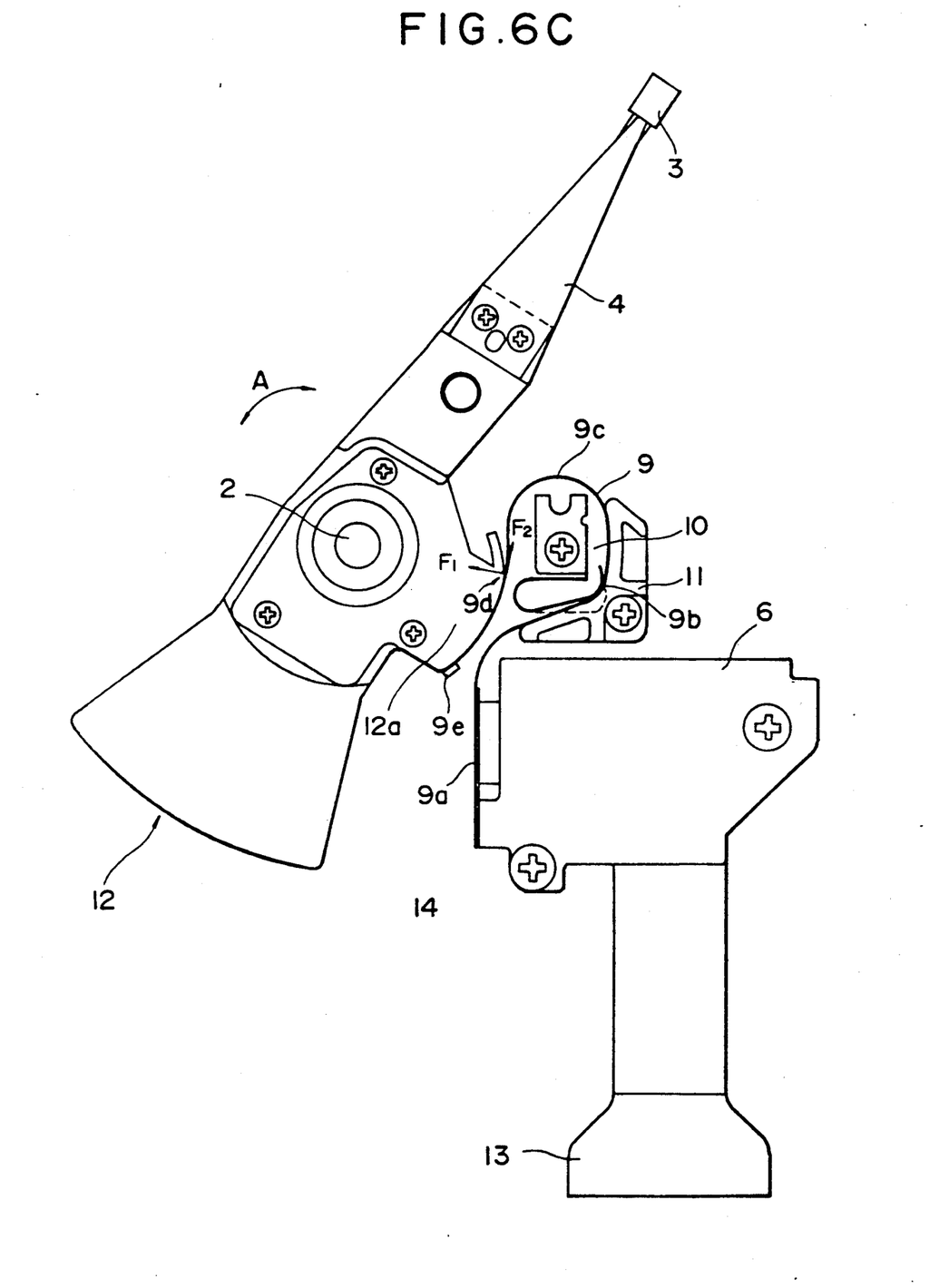

The shape of the attachment portion 12a of the actuator 12 will be described below. In this embodiment, the attachment portion 12a is formed so that the direction of the end part between 9d and 9e coincides with the tangential direction of the concentric circle which is centered at the shaft 2. The shape of the attachment portion 12a can be a parameter for attaching the FPC 9 so that the direction V coincides approximately with the center axis of the shaft 2. The FPC 9 is bent sharply at the point 9d depending upon the shape of the attachment portion 12a, and the elastic force of the FPC 9 caused by this cannot be disregarded. In addition, the direction V also changes depending upon the shape of the attachment portion 12a. Unlike the embodiment shown in FIG.6A, the attachment portion 12a may be formed as an arc of the circle $O_1$. Moreover, the arc may be extended to the head arm 4, as shown in FIG.6B. In addition, as shown in FIG.6C, a second stopper 17 which has a curved surface formed as an arc of the circle $O_1$ is attached to the attachment portion 12a at the point 9d. Accordingly, the FPC 9 is formed like the tangential direction of the circle $O_1$ at the point 9d. The second stopper 17 is fixed on the base 14 by a screw. The second stopper 17 is located at a position which does not block the locus of the moving of the head 3. The length of a part between 9b and 9d can be changed like the location of the flat spring 10 and/or the stopper 11, the curvature of the guide surface 11a of the stopper and the shape of the attachment portion 12a. The longer the FPC 9 is, the smaller the force of the FPC 9 against the actuator 12.

Figure 4:
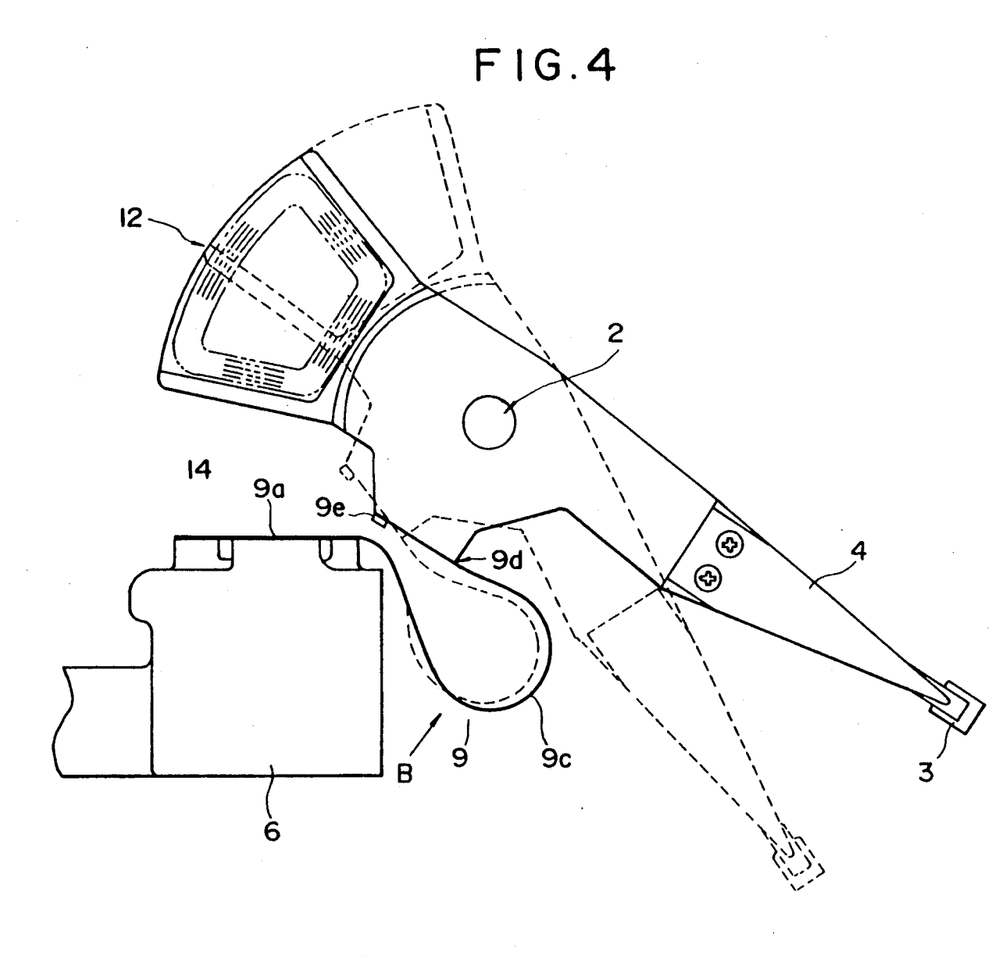
FIG.4 is a plane view of the magnetic disk drive shown in FIG.3 without a flat spring and stopper.
Figure 7:
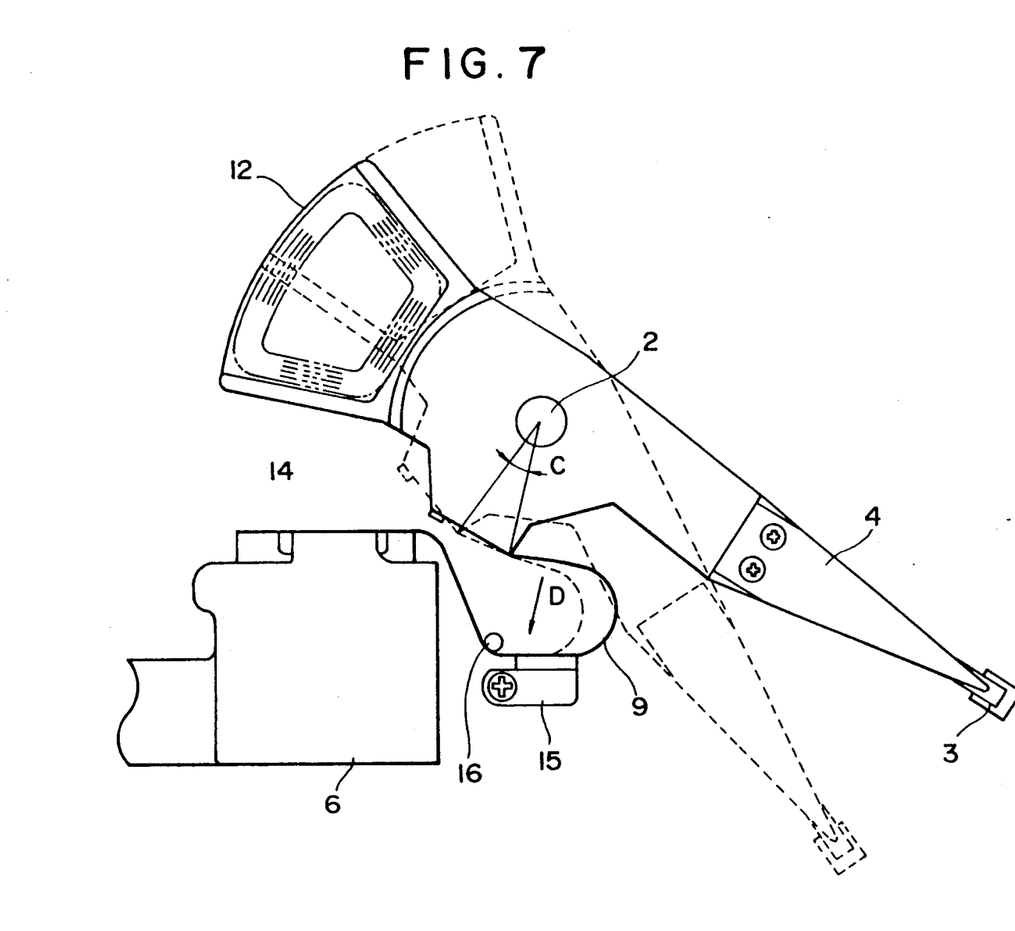
FIG.7 is a plane view of a magnetic disk drive of a second embodiment according to the present invention.
Figure 8:
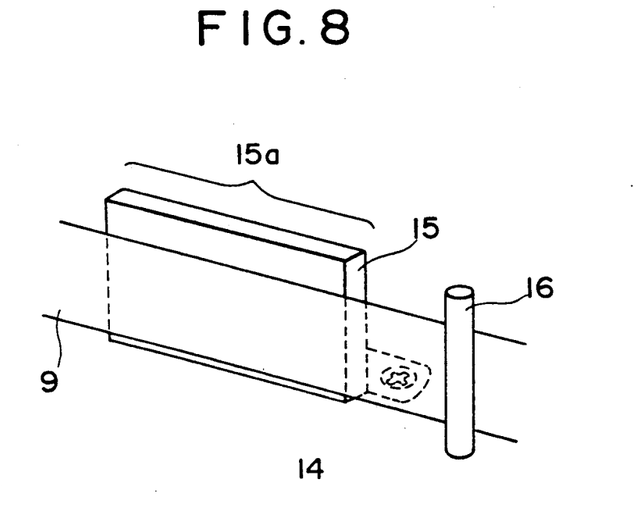
FIG.8 is a perspective view of a guide member and guide pin viewed from the direction D in FIG.7.

In the magnetic disk drive according to the present invention, the flat spring 10 and the stopper 11 are not absolutely necessary as long as the FPC 9 is forced in a direction B indicated in FIG.4. The magnetic disk drive of the second embodiment according to the present invention will be described with reference to FIG.7 and FIG.8. The FPC 9 in this embodiment is held by a guide surface 15a of the guide member 15 and a guide pin 16. As shown in FIG.8, the guide member 15 and the guide pin 16 are fixed on the base 14 by screws respectively. In this embodiment, the FPC 9 is pushed by the guide surface 15a by using the guide pin 16 and the elastic force of the FPC 9 itself. The guide member 15 may be the stopper 11 or it may be equipped with the guide pin 16. If the guide member 15 is equipped with the guide pin 16, only the guide member 15 may be attached on the base instead of the flat spring 10 and the stopper 11, which leads to a simpler attachment operation. The full line, in FIG.7, shows the actuator 12 with the head 3 at the most inner track of the disk 5, and the dotted line shows the head 3 at the most outer track of the disk 5. The rotational angle C is approximately 20°.

As mentioned above, the magnetic disk drive according to the present invention achieves higher positioning precision of the head 3 because the actuator 12 is hardly subjected to the moment around the shaft 2 even if the FPC 9 is attached thereto. Moreover the seek time is made uniform and the electricity supplied to the voice coil motor is lessened.

Next, an analog meter of the third embodiment according to the present invention will be described below. In principle, what is applicable to the analog meter is the same as the first and second embodiments, so a detailed description will be omitted.

Figure 9A:
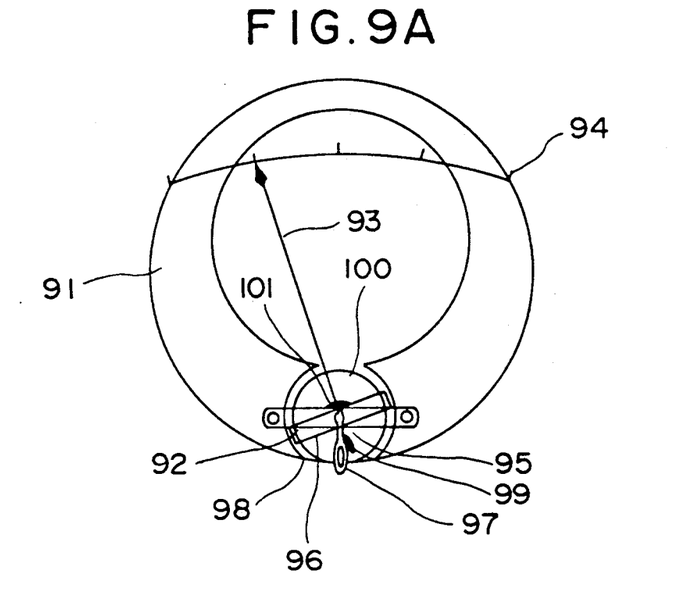
FIG.9A is a schematic view of a moving coil type instrument of a third embodiment according to the present invention.
Figure 9B:
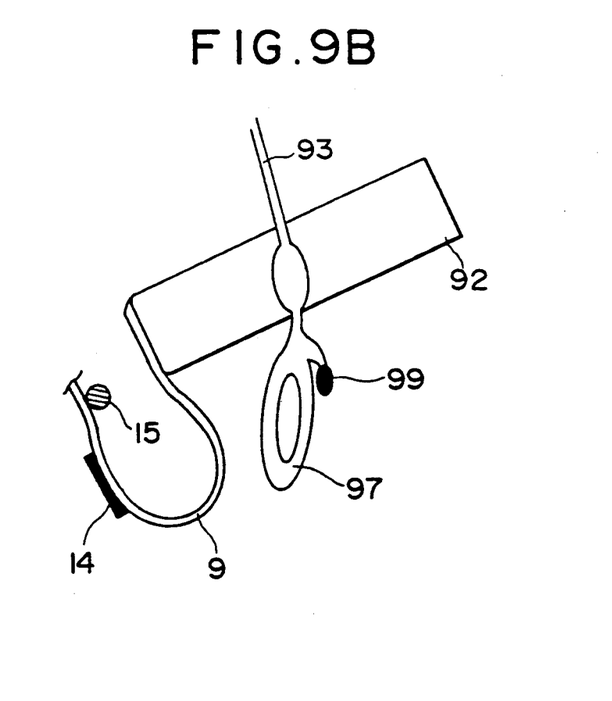
FIG.9B is a partly enlarged view for explaining the moving coil type instrument to which a flexible printed circuit board according to the present invention is attached.

A moving coil type instrument shown in FIG.9A is a meter which applies torque to a pointer 93 by using a electromagnetic force exerted by a moving coil 92 located within the magnetic field of a permanent magnet 91. The deviation of the pointer 93 is proportional to the measuring current and a scale plate 94 is of uniform scale. The instrument uses two spiral springs 95 for a controller and an aluminum spool of moving coil 96 for a breaker. Besides, a zero adjusting arm 87, a magnet setter 98, a load for pointer balance 99, a cylindrical soft iron core 100 and bearings 101 are also used. In this case, as shown in FIG.9B, the precision of the instrument would be higher if the FPC 9 is attached to the moving coil 92 so that the moment around the shaft is approximately zero by using the guide member 15 and the guide pin 16.

Further, the present invention is not limited to these preferred embodiments, but various variations and modifications may be made without departing from the scope of the present invention.

What is claimed is:

1. An apparatus having a rotary member comprising:
   a shaft mounted on a base;
   a rotary member rotatable about said shaft;
   a fixing member fixed on said base;
   a flexible printed circuit board which is connected to said rotary member at an end thereof and is fixed to said fixing member at the other end thereof, said flexible printed circuit board having a bent portion between both ends thereof; and
   a pushing member which pushes the bent portion of said flexible printed circuit board so that a direction of an elastic force exerted by the bending of said flexible printed circuit board against the rotary member coincides approximately to a center axis of the shaft irrespective of a rotary position of said rotary member, whereby
   a moment around the shaft, caused by the elastic force and to which said rotary member is subjected, to is approximately zero.

2. An apparatus having a rotary member according to claim 1, wherein
   said rotary member further comprises an attachment portion to which said flexible printed circuit board is attached,
   the elastic force at the attachment portion exerted by said flexible printed circuit board being divided into a component having a first direction and a component having a second direction, the first direction being parallel to a tangential direction of said flexible printed circuit board at the attachment portion, the second direction being vertical to the tangential direction, said pushing member pushing the bent portion so that the elastic force component having the second direction is directed to the center axis of said shaft.

3. An apparatus having a rotary member according to claim 2, wherein the attachment portion of said rotary member is formed as an arc of a concentric circle whose center is said shaft.

4. An apparatus having a rotary member according to claim 1, wherein said rotary member is a head actuator further comprising;
   a driving part including a driving coil;
   a supporting part, coupled to said driving part, pivotably mounted around a rotating shaft;
   a head arm, coupled to said supporting part, having a magnetic head; and wherein
   said shaft is the rotating shaft.

5. An apparatus having a rotary member according to claim 1, wherein said fixing member is connected electrically to said rotary member via said flexible printed circuit board.

6. An apparatus having a rotary member according to claim 1, wherein said pushing member further comprises:
   a guide member, mounted on the base, which has a guide surface which touches a part of the bent portion of said flexible printed circuit board, the guide member pushing the bent portion of said flexible printed circuit board by means of the guide surface; and
   a flat spring, mounted on the base opposite to the guide surface of said guide member, which pushes and holds the bent portion of said flexible printed circuit board at the guide surface.

7. An apparatus having a rotary member according to claim 6, wherein the guide surface of the guide member is formed as an arc of a concentric circle whose center is said shaft.

8. An apparatus having a rotary member according to claim 2, wherein said pushing member further comprises:
   a guide member, mounted on the base, which has a guide surface which touches a part of the bent portion of said flexible printed circuit board, the guide member pushing the bent portion of said flexible printed circuit board by means of the guide surface; and
   a pin, mounted on the base opposite to the guide surface of said guide member, which pushes and holds the bent portion of said flexible printed circuit board at the guide surface.

9. An apparatus having a rotary member according to claim 8, wherein the guide surface of the guide member is formed as an arc of a concentric circle whose center is said shaft.

10. An apparatus having a rotary member according to claim 2, wherein said pushing member further comprises:
    a guide member, mounted on the base, which has a guide surface which touches a part of the bent portion of said flexible printed circuit board, the guide member pushing the bent portion of said flexible printed circuit board by means of the guide surface; and
    bonding material for bonding a part of said flexible printed circuit board to the guide surface so that the bent portion of said flexible printed circuit board is held at the guide surface of said guide member.

11. An apparatus having a rotary member according to claim 10, wherein the guide surface of the guide member is formed as an arc of a concentric circle whose center is said shaft.

12. An apparatus having a rotary member according to claim 2, wherein said rotary member is a moving coil portion of an analog meter.

* * * * *